United States Patent [19]
Zerbe

[11] Patent Number: 5,258,986
[45] Date of Patent: Nov. 2, 1993

[54] TIGHTLY COUPLED, LOW OVERHEAD RAM BUILT-IN SELF-TEST LOGIC WITH PARTICULAR APPLICATIONS FOR EMBEDDED MEMORIES

[75] Inventor: Jared L. Zerbe, Mt. View, Calif.

[73] Assignee: VLSI Technology, Inc., San Jose, Calif.

[21] Appl. No.: 585,334

[22] Filed: Sep. 19, 1990

[51] Int. Cl.$^5$ .............................................. G11C 29/00
[52] U.S. Cl. .................................. 371/21.2; 371/21.1; 371/22.5; 371/27; 365/201
[58] Field of Search ....................... 371/21.2, 21.1.25.1, 371/24, 22.5, 15.1, 21.3, 27; 365/201

[56] References Cited

U.S. PATENT DOCUMENTS

| | | | |
|---|---|---|---|
| 3,751,649 | 8/1973 | Hart, Jr. .............................. | 371/21.3 |
| 4,965,799 | 10/1990 | Green et al. ......................... | 371/21.3 |
| 5,033,048 | 7/1991 | Pierce et al. ........................ | 371/21.2 |
| 5,053,698 | 10/1991 | Ueda .................................. | 371/25.1 |

OTHER PUBLICATIONS

"Signature analysis: A New Digital Field Service Method" Robert A. Frohwerk, Hewlett-Packard Company 1977, pp. 2-14.

"The Polynominal Counter Design Teechnique With Applications in Four-Phase Logic" Donald L. Moon, pp. 135-143, 1968.

"Built-in Test for RAMs" Bardell, Jr. et al., IBM Corp. 1988, pp. 29-36.

"An Optimal Algorithm for Testing Stuck at Faults in RAMs" Knaizuk et al.

"Signature Analysis Concepts, Examples and Guidelines" Hans J. Nadig, pp. 15-21.

*Primary Examiner*—Robert W. Beausoliel, Jr.
*Assistant Examiner*—Phung Chung
*Attorney, Agent, or Firm*—John A. Frazzini

[57] ABSTRACT

RAM Built-In Self-Test logic is presented that utilizes a linear feedback shift register (LFSR) to generate data. Preferably, an LFSR is also utilized for address generation during memory self-testing. More than one cycle is implemented with offset of successive data sequences relative to address sequences to increase fault coverage. Memory storage is utilized in the data generation to enable a reduced area of the data generation circuitry.

29 Claims, 9 Drawing Sheets

| Address | Word |
|---|---|
| 0 | 1 0 0 0 0 0 0 0 |
| 1 | 0 1 0 0 0 0 0 0 |
| 2 | 0 0 1 0 0 0 0 0 |
| 3 | 0 0 0 1 0 0 0 0 |
| 4 | 0 0 0 0 1 0 0 0 |
| 5 | 0 0 0 0 0 1 0 0 |
| 6 | 0 0 0 0 0 0 1 0 |
| 7 | 0 0 0 0 0 0 0 1 |
| 8 | 0 0 0 0 0 0 1 0 |
| 9 | 0 0 0 0 0 1 0 0 |
| 10 | 0 0 0 0 1 0 0 0 |
| 11 | 0 0 0 1 0 0 0 0 |
| 12 | 0 0 1 0 0 0 0 0 |
| 13 | 0 1 0 0 0 0 0 0 |
| 14 | 1 0 0 0 0 0 0 0 |
| 15 | 0 1 0 0 0 0 0 0 |
| 16 | 0 0 1 0 0 0 0 0 |
| 17 | 0 0 0 1 0 0 0 0 |
| 18 | 0 0 0 0 1 0 0 0 |
| 19 | 0 0 0 0 0 1 0 0 |
| 20 | 0 0 0 0 0 0 1 0 |
| 21 | 0 0 0 0 0 0 0 1 |
| 22 | 0 0 0 0 0 0 1 0 |
| 23 | 0 0 0 0 0 1 0 0 |
| 24 | 0 0 0 0 1 0 0 0 |
| 25 | 0 0 0 1 0 0 0 0 |
| 26 | 0 0 1 0 0 0 0 0 |
| 27 | 0 1 0 0 0 0 0 0 |
| 28 | 1 0 0 0 0 0 0 0 |
| 29 | 0 1 0 0 0 0 0 0 |
| 30 | 0 0 1 0 0 0 0 0 |
| 31 | 0 0 0 1 0 0 0 0 |
| 32 | 0 0 0 0 1 0 0 0 |

Figure 2 (Prior Art)

| Address | Word |
|---|---|
| 0 | 0 1 1 1 1 1 1 1 |
| 1 | 1 0 1 1 1 1 1 1 |
| 2 | 1 1 0 1 1 1 1 1 |
| 3 | 1 1 1 0 1 1 1 1 |
| 4 | 1 1 1 1 0 1 1 1 |
| 5 | 1 1 1 1 1 0 1 1 |
| 6 | 1 1 1 1 1 1 0 1 |
| 7 | 1 1 1 1 1 1 1 0 |
| 8 | 1 1 1 1 1 1 0 1 |
| 9 | 1 1 1 1 1 0 1 1 |
| 10 | 1 1 1 1 0 1 1 1 |
| 11 | 1 1 1 0 1 1 1 1 |
| 12 | 1 1 0 1 1 1 1 1 |
| 13 | 1 0 1 1 1 1 1 1 |
| 14 | 0 1 1 1 1 1 1 1 |
| 15 | 1 0 1 1 1 1 1 1 |
| 16 | 1 1 0 1 1 1 1 1 |
| 17 | 1 1 1 0 1 1 1 1 |
| 18 | 1 1 1 1 0 1 1 1 |
| 19 | 1 1 1 1 1 0 1 1 |
| 20 | 1 1 1 1 1 1 0 1 |
| 21 | 1 1 1 1 1 1 1 0 |
| 22 | 1 1 1 1 1 1 0 1 |
| 23 | 1 1 1 1 1 0 1 1 |
| 24 | 1 1 1 1 0 1 1 1 |
| 25 | 1 1 1 0 1 1 1 1 |
| 26 | 1 1 0 1 1 1 1 1 |
| 27 | 1 0 1 1 1 1 1 1 |
| 28 | 0 1 1 1 1 1 1 1 |
| 29 | 1 0 1 1 1 1 1 1 |
| 30 | 1 1 0 1 1 1 1 1 |
| 31 | 1 1 1 0 1 1 1 1 |
| 32 | 1 1 1 1 0 1 1 1 |

Figure 3 (Prior Art)

| Address | Word |
|---|---|
| 0 | 0 1 0 1 0 1 0 1 |
| 1 | 1 0 1 0 1 0 1 0 |
| 2 | 0 1 0 1 0 1 0 1 |
| 3 | 1 0 1 0 1 0 1 0 |
| 4 | 0 1 0 1 0 1 0 1 |
| 5 | 1 0 1 0 1 0 1 0 |
| 6 | 0 1 0 1 0 1 0 1 |
| 7 | 1 0 1 0 1 0 1 0 |
| 8 | 0 1 0 1 0 1 0 1 |
| 9 | 1 0 1 0 1 0 1 0 |
| 10 | 0 1 0 1 0 1 0 1 |
| 11 | 1 0 1 0 1 0 1 0 |
| 12 | 0 1 0 1 0 1 0 1 |
| 13 | 1 0 1 0 1 0 1 0 |
| 14 | 0 1 0 1 0 1 0 1 |
| 15 | 1 0 1 0 1 0 1 0 |
| 16 | 0 1 0 1 0 1 0 1 |
| 17 | 1 0 1 0 1 0 1 0 |
| 18 | 0 1 0 1 0 1 0 1 |
| 19 | 1 0 1 0 1 0 1 0 |
| 20 | 0 1 0 1 0 1 0 1 |
| 21 | 1 0 1 0 1 0 1 0 |
| 22 | 0 1 0 1 0 1 0 1 |
| 23 | 1 0 1 0 1 0 1 0 |
| 24 | 0 1 0 1 0 1 0 1 |
| 25 | 1 0 1 0 1 0 1 0 |
| 26 | 0 1 0 1 0 1 0 1 |
| 27 | 1 0 1 0 1 0 1 0 |
| 28 | 0 1 0 1 0 1 0 1 |
| 29 | 1 0 1 0 1 0 1 0 |
| 30 | 0 1 0 1 0 1 0 1 |
| 31 | 1 0 1 0 1 0 1 0 |

**Figure 4
(Prior Art)**

| Address | Word |
|---|---|
| 0 | 0 0 0 0 0 0 0 0 |
| 1 | 0 0 0 0 0 0 0 1 |
| 2 | 0 0 0 0 0 0 1 0 |
| 3 | 0 0 0 0 0 0 1 1 |
| 4 | 0 0 0 0 0 1 0 0 |
| 5 | 0 0 0 0 0 1 0 1 |
| 6 | 0 0 0 0 0 1 1 0 |
| 7 | 0 0 0 0 0 1 1 1 |
| 8 | 0 0 0 0 1 0 0 0 |
| 9 | 0 0 0 0 1 0 0 1 |
| 10 | 0 0 0 0 1 0 1 0 |
| 11 | 0 0 0 0 1 0 1 1 |
| 12 | 0 0 0 0 1 1 0 0 |
| 13 | 0 0 0 0 1 1 0 1 |
| 14 | 0 0 0 0 1 1 1 0 |
| 15 | 0 0 0 0 1 1 1 1 |
| 16 | 0 0 0 1 0 0 0 0 |
| 17 | 0 0 0 1 0 0 0 1 |
| 18 | 0 0 0 1 0 0 1 0 |
| 19 | 0 0 0 1 0 0 1 1 |
| 20 | 0 0 0 1 0 1 0 0 |
| 21 | 0 0 0 1 0 1 0 1 |
| 22 | 0 0 0 1 0 1 1 0 |
| 23 | 0 0 0 1 0 1 1 1 |
| 24 | 0 0 0 1 1 0 0 0 |
| 25 | 0 0 0 1 1 0 0 1 |
| 26 | 0 0 0 1 1 0 1 0 |
| 27 | 0 0 0 1 1 0 1 1 |
| 28 | 0 0 0 1 1 1 0 0 |
| 29 | 0 0 0 1 1 1 0 1 |
| 30 | 0 0 0 1 1 1 1 0 |
| 31 | 0 0 0 1 1 1 1 1 |

**Figure 5
(Prior Art)**

TIGHTLY COUPLED, LOW OVERHEAD RAM BUILT-IN SELF-TEST LOGIC WITH PARTICULAR APPLICATIONS FOR EMBEDDED MEMORIES

BACKGROUND OF THE INVENTION

In the figures, each element indicated by a reference numeral will be indicated by the same reference numeral in every figure in which that element appears. The first two digits of any four digit reference numerals and the first digit of any two or three digit reference numerals indicates the first figure in which its associated element is presented.

This invention relates in general to random access memory (RAM) and relates more particularly to tightly coupled, low overhead built-in self-test (BIST) logic that tests for fabrication errors. By "tightly coupled" is meant that the logic is located physically within the RAM block and has access to internal RAM signals that are not usually accessible via pins on the edges of a RAM chip. Access to internal RAM signals is required to simplify the BIST logic required. By "low overhead" is meant that the BIST logic requires a small amount of chip area.

During fabrication of a RAM, various processing errors can result in undesired shorts and opens. Because RAM chips are often manufactured with state of the art linewidths and fabrication processes, these chips are particularly susceptible to the inclusion of shorts and opens.

A short between adjacent bits will force these two bits to assume the same binary values, even when data entered into these two bits are unequal. Shorts between a pair of adjacent word lines or a pair of adjacent bit lines are more common. A short between bit lines causes these bits to be equal in every word that is accessed. A short between two word lines forces two words to be accessed simultaneously.

Bit shorts and opens to power and ground nodes can cause a bit to be stuck to zero or stuck to one. When any of these events occurs in data bits of the RAM, these shorts and opens will produce faulty data. When any opens occur in address bits, only a subset of the physical memory can be accessed. When any shorts occurs in address bits, writing to the intended memory location will also cause undesired writes at another location. Thus, an address error can adversely affect data in two locations.

It is important to test RAM chips for each of these manufacturing errors. BIST logic can be much more efficient than a chip tester in testing a RAM chip because it has direct access to internal signals that are not directly accessible by the chip tester. Embeddible testing can always be run at high speed because it doesn't require high frequency output pins, which are often difficult to test. Additionally, non-embedded tests often require the application of multiple test vectors to the pins of a RAM chip to produce a single desired RAM access. Thus, testing via embedded BIST logic can be easier and can significantly increase fault coverage within a given period of time. Therefore, embeddable built-in self-test (BIST) can be an effective test for fabrication errors.

FIG. 1 illustrates a typical random access memory core 11 and its associated input/output (I/O) circuits 12-14 and BIST logic 15-17. The I/O circuits include a memory data register (MDR) 12, a memory address register (MAR) 13 and an address decoder 14. The BIST logic includes BIST address generation logic 15, control logic 16 and data generation logic 18 and a data comparator 17. This comparator compares data generated by data generation logic with the data in MDR 12.

The RAM test sequence consists of a first phase of writing data to the RAM and a second phase of reading this data from the RAM and comparing it with expected data. During the first phase, address generation logic 15 produces a first sequence of addresses and, for each generated address, data generation logic 16 produces a data word that is written to the location identified by the generated address. During the second phase, address generation logic 15 generates the same sequence of addresses and, for each generated address, a comparator 17 compares the data in the location identified by that address with the data predicted to be in that location by the combination of the previous data stored in the MDR and the data generation logic.

Previously, a variety of algorithms have been utilized to test for the assortment of shorts and opens that can occur. These algorithms include that proposed by Knaizuk and Hartmann (see, for example, John Knaizuk, Jr., et al, *An Algorithm for Testing Random Access Memories*, IEEE Transactions On Computers, April 1977, p. 114 and John Knaizuk, Jr. and Carlos R. P. Hartmann, *An Optimal Algorithm for Testing Stuck-at Faults in Random Access Memories*, IEEE Transactions On Computers, vol. C-26;, No. 11, November 1977, P. 1141) as well as checkerboard, walking 1's, walking 0's and write address algorithms.

The walking 1's algorithm is illustrated in FIG. 2 and the walking 0's algorithm is illustrated in FIG. 3. Because both of these patterns assure that nearby words are unequal, either of these algorithms is useful in detecting whether two nearby words are shorted together or whether two address bits are shorted together. However, because most bits in adjacent words are equal, there is a very low fault coverage for shorts between adjacent pairs of data bits unless the pattern is shifted and repeated.

The checkerboard algorithm is illustrated in FIG. 4. This algorithm is particularly useful in testing for shorts between bits that are immediately adjacent within the same word or across two words. However, it does not test for most other types of shorts such as single bit shorts between bits that are offset by ±1 bit location in immediately adjacent words. It does not test for word-length shorts between words spaced an even number of words apart. It also does not test for single bit address shorts that result in the same data being written to or read from addresses spaced an even number of words apart.

The write address algorithm, illustrated in FIG. 5, simplifies the identification of the addresses of two words that are stuck together. After writing into each location the address of that location, if the words at two addresses are shorted together, then both of these words will contain the same address. When an error is detected during the second phase of the RAM test sequence, an error will be detected at the location that does not contain its address.

Each of these algorithms has various strengths and weaknesses. For example, the write address makes it easy to identify which of pairs or sets of words are shorted together. However, it is poor at identifying single bit errors because, for most adjacent words, these two words will have the same bit values in most bit locations. Thus, for good fault coverage (i.e., for an ability to detect a high fraction of all possible RAM data storage errors), several different algorithms need to be implemented. Unfortunately, the implementation of several different RAM test algorithms requires an unreasonably large amount of cumbersome built-in logic.

Because there is little available room on a RAM chip for test circuitry, it is advantageous to implement a RAM test algorithm that does not require a large amount of chip area. In general, because the built-in self-test (BIST) circuitry is typically utilized either only as part of the manufacturing process or, during power up of a device to identify whether an included RAM chip is good or not. Additionally, in order to avoid undue time and expense in testing these chips, it is also important to have a shorts test. Thus, it is necessary to achieve as good or better fault coverage with BIST is done as with test vectors at the expense of as little logic as possible and in as little time as possible.

Using a BIST algorithm, a 50 ns, 1 megabit RAM can be fully loaded with a single pattern of data and checked for errors in a time approximately one two-hundredths of a second, assuming a 128 k×8 layout structure. However, for acceptable fault coverage, several different patterns need to be successively loaded into the RAM and the actual values of the stored data needs to be compared with the intended values to be stored. Such a test could therefore require several seconds.

Pseudorandom sequences, such as those generated by linear feedback shift registers (LFSRs), have been used to implement a variety of testing. However, these LFSR tests require a significant amount of chip area and/or exhibit a poor level of fault coverage for a given period of time.

SUMMARY OF THE INVENTION

In accordance with the illustrated preferred embodiment, built-in self-test (BIST) logic is presented that provides excellent fault coverage and requires a smaller amount of logic, and hence also requires a smaller amount of chip area, than prior devices exhibiting comparable fault coverage. When the BIST circuitry is enabled, BIST logic executes two basic phases: (1) write the RAM; and (2) read the RAM and compare with expected values. Phase two is implemented only after phase one writes to all RAM locations. During phase two, the logic generates the same sequence of addresses and data as were generated in phase one. However, in phase two, the generated data is compared with the data already stored in the addressed RAM memory location. Any discrepancy between these two words of data is flagged as a fault within the RAM.

Prior test devices achieve reasonable fault coverage by implementing several different RAM test sequences, thereby requiring several different clusters of logic. This large amount of logic requires a large amount of chip area. In contrast to this, the present logic is simple, a much smaller amount of chip area is required for the BIST circuitry and excellent fault coverage can be achieved in a reasonable time period.

In the present device, for a RAM having $2^m$ addresses containing n-bit words, word generators produce a first sequence $F_k$ that is a pseudorandom sequence of words and a second sequence $A_k$ of words. One of the first two sequences is utilized as a sequence $A_k$ of addresses and the other is utilized as sequence $D_k$ of data. For each value of k, the data $D_k$ is stored in the memory location at address $A_k$. Even if second sequence $S_k$ is generated by a simple n-bit counter, the pseudorandom nature of the first sequence $F_k$ assures that each pair of adjacent data words in the RAM core will differ in at least as many bit locations as there are LFSR taps. This results in a relatively high level of single bit fault coverage in even a single repetition of filling the RAM core with test data. This contrasts most particularly with the write-address algorithm in which most data words differ from adjacent data words in only a few bit locations and therefore exhibits a relatively low fault coverage.

The preferred embodiment utilizes pseudorandom bit sequence generators for both address and data generation. These are efficiently implemented as linear feedback shift registers having reduced overhead through utilization of the storage already available in the memory address register and the memory data register that typically exist in a RAM design.

Because of the pseudorandom nature of the addresses, even a single offset of the address sequence will completely rearrange the order in which data words are located within the RAM core. Fault coverage is increased by making multiple passes through the RAM with the data and address counters at different relative positions. This is easily accomplished by shortening the length of the address or the data counter from $2^m$ to the more natural LFSR count of $2^m-1$ while keeping the other of these counters at a length of $2^m$. For example, if, during the phase two read cycle, the LFSR producing a address sequence length is reduced to $2^m-1$, then the data $D_k$ is stored at address $A_k$ for $k=0,\ldots,2^m-1$, $D_0$ is stored at address $A_M$ (where $M=2^m$) and then, for $k=1,\ldots,2^m-1$, the $D_k$ are each stored at address $A_{k-1}$, etc. Therefore, in each cycle through the set of addresses, there is an offset by one of the data sequence relative to the data sequence stored in the prior cycle. As a result of this, for any pair of bits in adjacent memory locations, there is at least a 50—50 chance that these bits will be written with unequal values. Other values q of the offset can also be used to achieve the same type of increased fault coverage.

After R repetitions, there is substantially only a $2^{-R}$ chance that any two adjacent physical bit locations have been written with equal values in all of these tests R repetitions. Therefore, testing of shorted bit pairs is very effective. There is less than a $2^{-R}$ chance that the same binary value has been written into a given bit location every repetition. Therefore, testing of stuck bits is very effective. Additionally, there is a "best case" initial starting condition of the data and address LFSRs that will provide the highest fault coverage in the fewest number of cycles for each set of RAM dimensions. When test mode is initiated, logic 67 loads the MAR and MDR with the initial starting condition. If chip area is more critical than testing time, then no preloading is required and instead the test begins with whatever data and address values exist at the time that such test is initiated. Since the initial states are not optimized, a longer test time is required to assure a given level of fault coverage.

The number of repetitions is selected to achieve the desired level of fault coverage. This scheme requires much less logic and chip area than prior BIST logic providing comparable fault coverage, and, though it may require more RAM cycles, the RAM may be cycled at maximum speed, because it requires no external signals other than a clock.

Because of the substantially random sequence of test vectors, the time required to achieve a given degree of fault coverage varies as a function of the choice of the initial test vector in this sequence. For any given choice of RAM core size, simulations can be performed to identify one or more choices of the initial test vector that will minimize the time required to achieve this desired level of fault coverage.

The area required for the BIST circuitry is further reduced by utilizing RAM core bits and a small amount of logic to produce the functional equivalent of a linear feedback shift register to generate a pseudorandom sequence of data words. The use of RAM core bits and the memory data register for this purpose avoids the need to take up chip area for dedicated registers to implement LFSR data generation during RAM test.

The use of the memory data register for LFSR storage and the RAM core for "next state" data values avoids the need to take up additional area for data generation. When the word length n and the address length m are equal, the address and data pseudorandom sequences are intentionally different so that the write-address algorithm is not implemented. If these two sequences were equal, the only effect of the pseudorandom sequence would be to implement the write-address algorithm in a random order of occurrence. Unequal sequences can be assured by the use of pseudorandom sequence generators with m unequal to n or the use of pseudorandom sequence generators having an initial offset between their sequences.

DESCRIPTION OF THE FIGURES

FIG. 2 illustrates a walking 1's pattern in memory.

FIG. 3 illustrates a walking 0's pattern in memory.

FIG. 4 illustrates a checkerboard pattern in memory.

FIG. 5 illustrates a write-address pattern in memory.

DESCRIPTION OF THE PREFERRED EMBODIMENT

Figure 1:
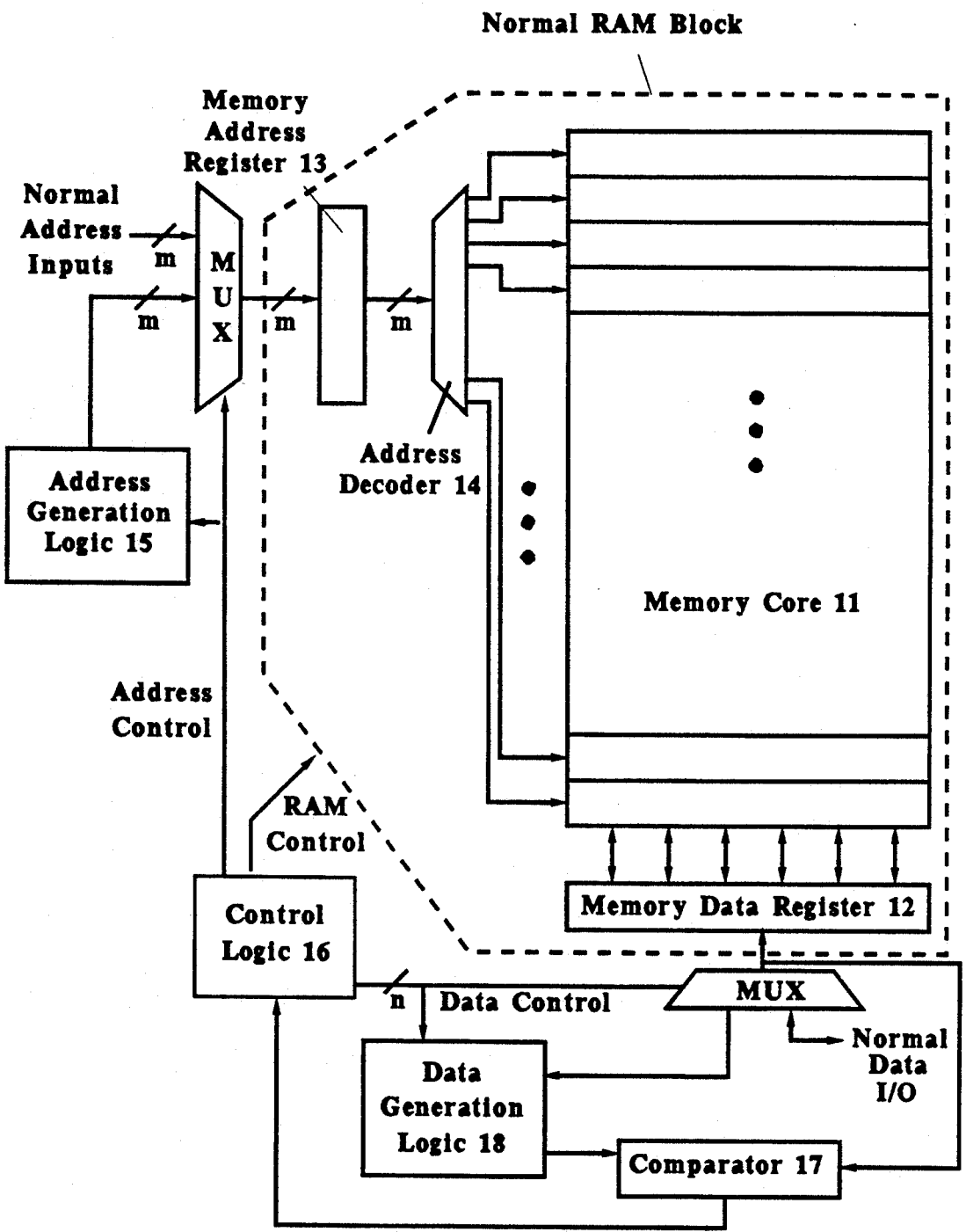
FIG. 1 illustrates a random access memory core and its associated input/output circuits and BIST logic.
Figure 6:
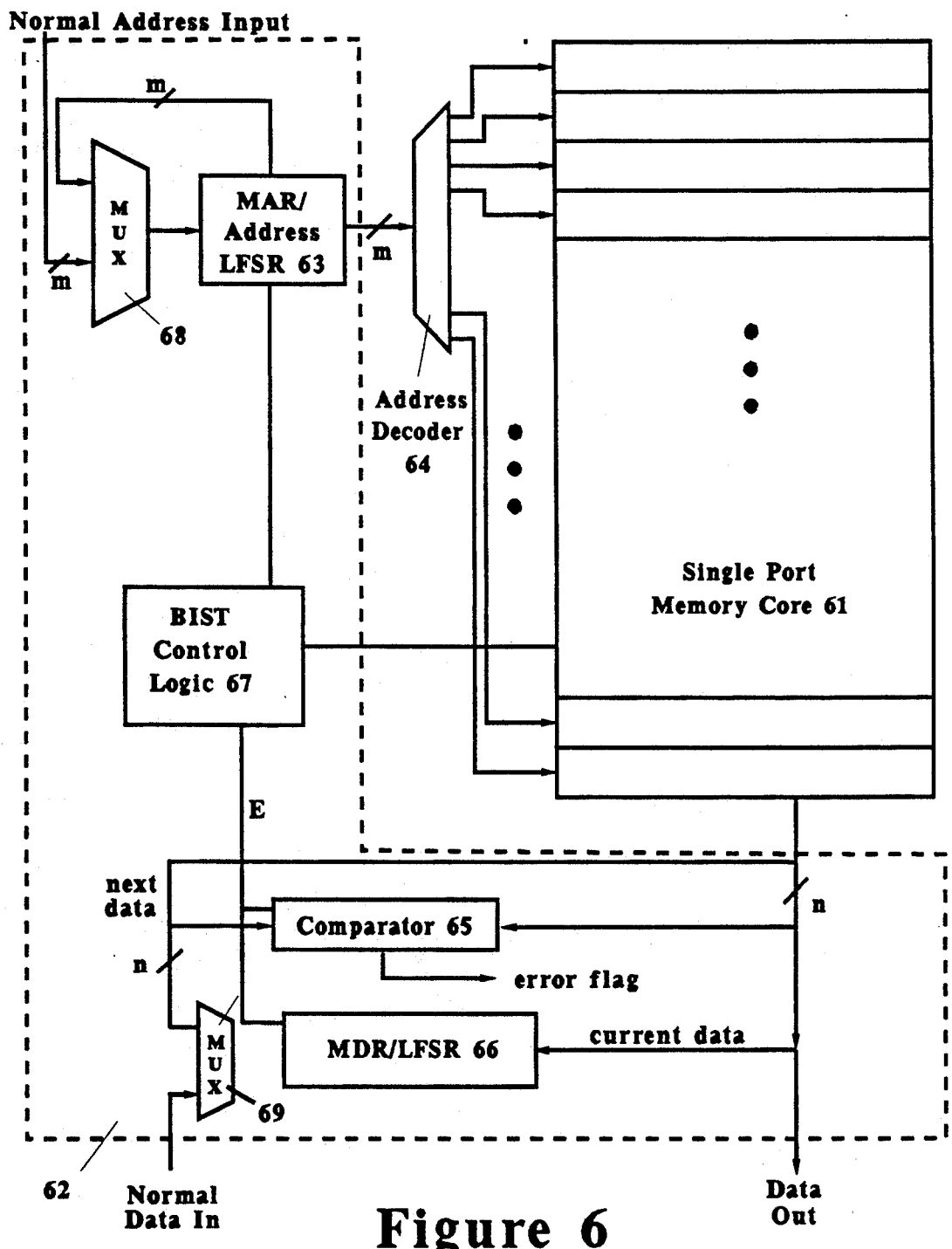
FIG. 6 illustrates a random access memory having a pair of linear feedback shift registers to generate pseudorandom sequences of addresses and data.

FIG. 6 illustrates a single port random access memory (RAM) core 61 having built-in self-test (BIST) logic 62 that utilizes the memory address register (MAR) and the memory data register (MDR) of the memory to generate a pseudorandom sequence of data and addresses. The BIST logic includes combined MAR and address linear feedback shift register (LFSR) 63 that either generates a pseudorandom bit sequence (PRBS) of m-bit addresses or functions as a normal MAR. These addresses are applied to an address decoder 64 that excites the address line for the memory location identified by the applied address.

MAR/Address LFSR 63 consists of a conventional linear feedback shift register (LFSR) and some additional logic that enables the zero address to be generated as part of the pseudorandom sequence. Via an external MUX 68, this LFSR not only performs the role of a pseudorandom bit sequence (PRBS) generator, it also performs the role of a memory address register (MAR) for the RAM, thereby enabling the core to operate as a normal synchronous RAM. Which input line of the MUX 68 is selected is controlled by BIST control logic 67.

Figure 7:
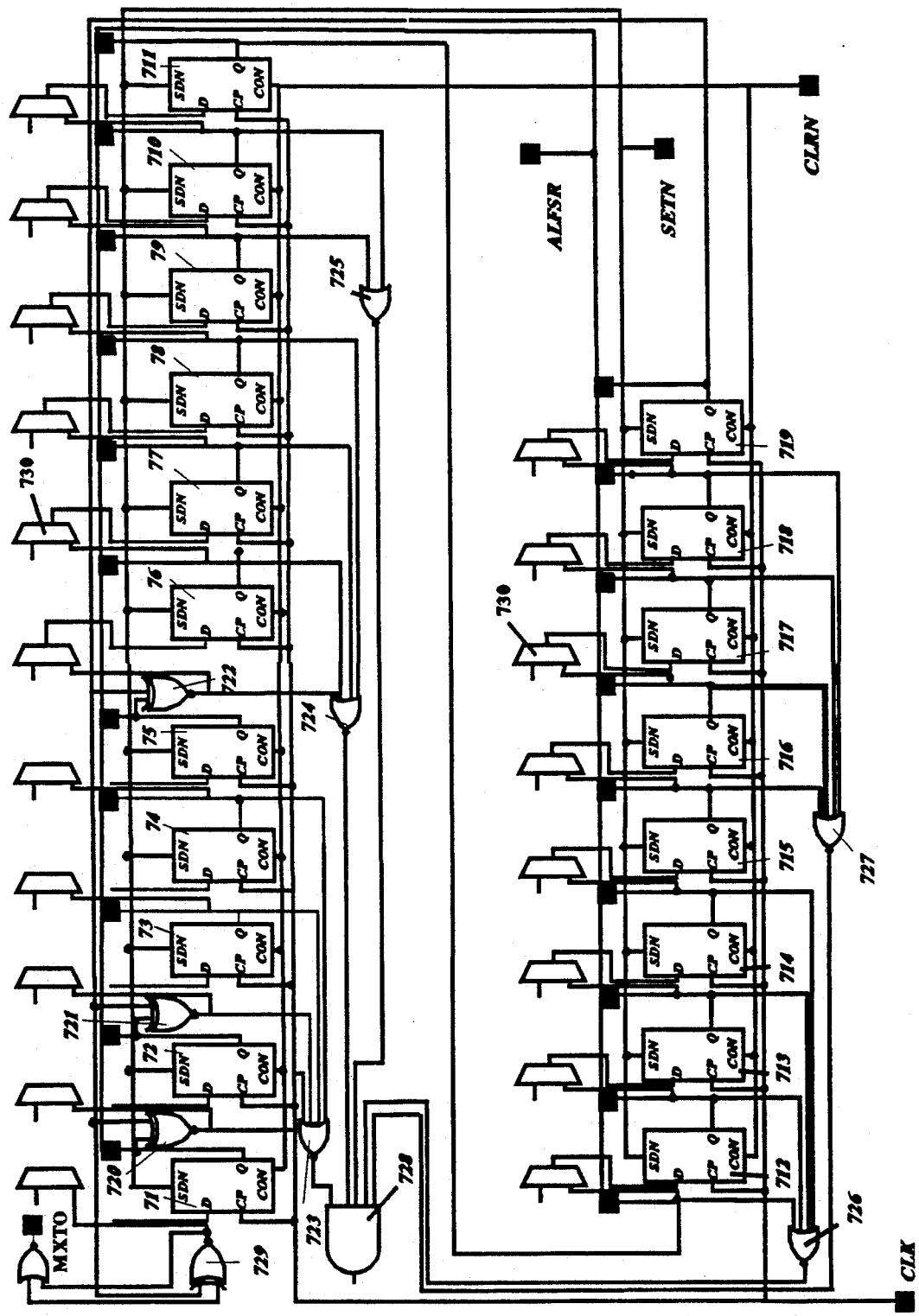
FIG. 7 illustrates a typical 19-bit linear feedback shift register for generating a pseudorandom sequence of addresses, implementing a $2^{19}$ sequence.

An example of an appropriate LFSR for use in address generation is illustrated in FIG. 7. This LFSR produces $2^{19}$ different 19-bit addresses, including the address zero. This LFSR utilizes a shift register consisting of 19 serially connected D-type flip-flops 71–79 and 710–719. A set of three XOR gates 720–722 implemente the feedback function $1+X+X^2+X^5+X^{19}$, thereby converting this shift register into a LFSR.

A conventional LFSR does not typically generate the value zero. However, since it is important to be able to test the zero address as well as the other addresses, it is important to include additional logic 723–729 that enables this LFSR to produce all possible $2^{19}$ addresses, including the address zero. This is easily achieved by detecting when the address one has been generated, forcing the next address to be zero and then continuing the normal sequence of address generation. In this embodiment, NOR gates 723–727 and AND gate 728 detect when the shift register contains the values zero or one. Only when this occurs does the output of AND gate 728 go high.

When this high value is input XOR gate 729 and a one is located in register 719, this forces a zero bit to be entered into the first register of the shift register. Thus, when the shift register contains the value one, elements 723–729 force the next value of data in the shift register to be zero. In the next clock cycle, the output of AND gate 728 is again high, but the input to XOR gate 729 from register 719 is now zero so that XOR gate 729 injects the value one into register 71. Normal address generation then continues until the value one is again produced in the shift register.

Because LFSR 63 functions as the memory address register, RAM core 61 can operate at the higher speeds enabled by sychronous transmission of data into the RAM. Thus, in comparison to a conventional synchronous RAM having a memory address register, the added overhead to produce a pseudorandom sequence of addresses involves only the logic required to implement the LFSR feedback paths and the MUXes 730 required to select between normal address input and LFSR address input. BIST control logic 67 also controls selection between these two choices of input.

Figure 8:
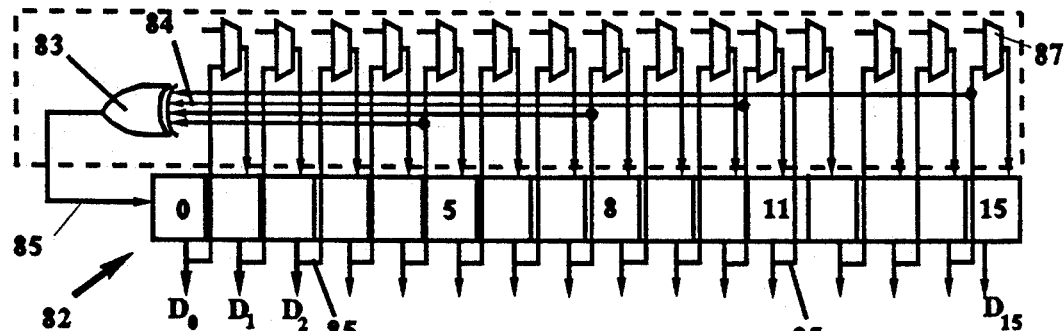
FIG. 8 illustrates a linear feedback shift register for generating a pseudorandom sequence of words of data.

An example of an appropriate data LFSR is illustrated in FIG. 8. Note that in FIG. 8, all of the taps feed into a single exclusive-OR gate 83 having its output connected to the input of the lowest order bit of the shift register 66. This contrasts with the shift register of FIG. 7 in which the individual taps each has its own exclusive-OR gate. These are just two possible ways to build LFSRs and either can be used for the data LFSR and the address LFSR. This particular LFSR 66 produces a pseudorandom sequence of $2^{16}$ 16-bit data words and consists of two sections. The first section is a register 82 that consists of 16 serially connected D-type flip-flops. The second section is an exclusive-OR (XOR) gate 83 having four input lines 84 and one output line 85. The input lines connect each of the outputs of the 5th, 8th, 11th and 15th D-type flip-flops to an input of XOR gate 83. The output line connects to the input of LFSR 82. Additionally, to use the MDR bits as LFSR storage, MUXes 87 are again used. The 16 output lines 86 from the LSFR enable parallel output of these 16 bits $a_0, \ldots, a_{15}$ as a 16-bit data word. As in the address case, the use of the MDR register as the flip-flops for the LFSR allows for low overhead BIST.

The BIST circuitry 62 (of FIG. 6) also includes a comparator 65 and a MDR/data LFSR 66. When the BIST circuitry is enabled, BIST logic executes two basic phases: (1) write the RAM; and (2) read the RAM and compare these values with expected values. During phase one, BIST control logic 67 pulls the write line of memory core 61 high, inactivates comparator 65 and activates the LFSR of MAR/Address LFSR 63 and the LFSR of MDR/LFSR 66 to generate a sequence of addresses and data words, respectively. Phase two is implemented only after phase one writes to all RAM locations. That is, at the end of phase one, the address LFSR has completed one full cycle. During phase two, comparator 65 is activated, the read line of memory core 61 is pulled high and LFSR 63 and LFSR 66 are again activated to generate a sequence of addresses and data words, respectively. In each successive clock cycle, comparator 65 compares the expected data value, generated by LFSR 66 from the previous data word output held in the MDR registers, with the data stored in the address location indicated by the address from LFSR 63. Any discrepancy between these two words of data is flagged as a storage error. Additionally, during phase 2, the duration of MAR/Address LFSR 63 is shortened to $2^m - 1$ from $2^m$. This provides an offset between the address and data LFSRs for the next pass through writing and reading the RAM.

A linear feedback structure that produces a pseudorandom sequence of $2^m$ m-bit numbers is referred to as a "maximal" length pseudorandom bit sequence (PRBS) generator. LFSR 66 is an example of a maximal length pseudorandom bit sequence generator. There are 2048 different feedback combinations for a 16-bit LFSR that produce a maximal length sequence (See, the article by Robert A. Frohwerk entitled *Signature Analysis: A New Digital Field Service Method*, Hewlett-Packard Journal, May 1977, p.2). The only 16-bit number that is not generated is zero.

Because, after each write of $2^m$ addresses, the read cycle is shortened to $2^m - 1$, the data and address values are offset relative to one another, thereby increasing fault coverage with each subsequent pass. Indeed, only after $2^{m-n}$ repetitions of phases one and two of this procedure will the same pattern of data be stored in the memory core. Each successive cycle increases the fault coverage of this memory core test. Simulation of the fault coverage enables a determination of the number of repetitions of phases one and two that are required to achieve a given level of fault coverage. In this embodiment, BIST control logic 67 counts the number of repetitions of these two phases and terminates the fault test either when the error flag is set or when a preselected number of cycles of the fault test have been performed.

In other embodiments, circuitry can be included to introduce other values of offset between successive cycles of the fault test. Similarly, in other embodiments, either the address LFSR or the data LFSR may be replaced by some other type of pseudorandom bit sequence generator or even by a counter. If either the address or data LFSRs is replaced by a counter that is incremented by a fixed value in each clock cycle, then the pseudorandom pattern of the numbers produced by the remaining LFSR will still result in a pseudorandom distribution of data throughout the memory core, but requires more logic. In other embodiments, the LFSR does not utilize the registers available in the core and instead requires additional registers to implement such LFSRs.

The use of an LFSR for both address and data generation is particularly advantageous in reducing the chip area that is required to implement the test algorithm. In general, only a few exclusive-OR (XOR) gates and a set of MUXes are needed to convert the MAR/MDR into an LFSR. For example, for the case of $n=16$, as illustrated in FIG. 8, the feedback logic requires only a single XOR gate 83. Similarly, only a small amount of additional logic is need to convert a conventional memory address register or memory data register into a combination MAR/MDR and shift register. Therefore, only a small amount of logic is needed to produce LFSRs at the address and data input of the memory core.

In order to mimic the data shift function of a shift register, logic 85 shifts data from the kth bit of a memory data latch 86 to the (k+1)th bit of latch 86 (for $k=0, \ldots, n-2$). To further convert the memory address register into an address LFSR, XOR gate 83 and lines 84 are included to feed bits 5, 8, 11 and 15 through XOR gate 83 to the input of bit 1 of register 82.

Figure 9:
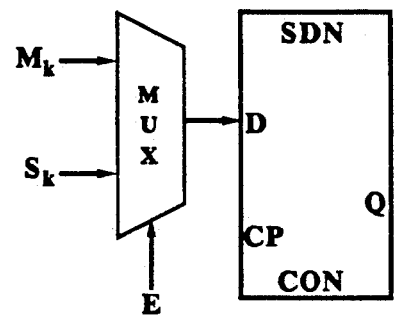
FIG. 9 illustrates circuitry for enabling and disabling the BIST logic.

Circuitry illustrated in FIG. 9 is included to enable the memory data register to function as an LFSR during self test activation and to function as a normal memory data register otherwise. A simple MUX before the D-input of each D-type flip-flop in the LFSR allows this. In MOS, this can be implemented with only two transistors. When an enable signal E is high, its normal input signal $S_k$ as part of shift register 82 is applied to its D input. When this enable signal E is low, the input signal $M_k$ from the kth data output line of memory core 61 is applied to its D input. Therefore, BIST logic switches the memory data register between normal operation and BIST mode operation by means of the enable signal E from BIST control logic 67.

Figure 10:
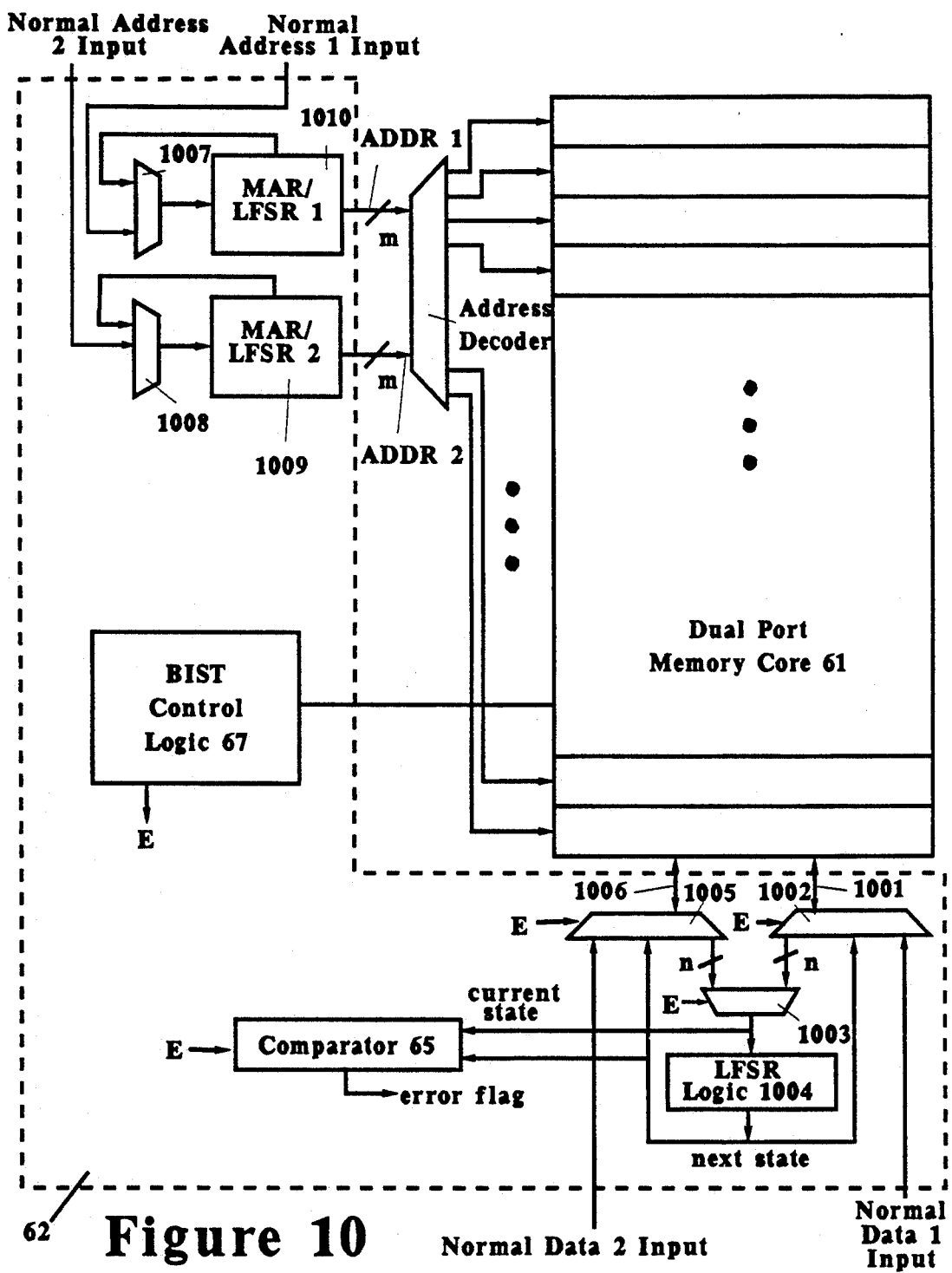
FIG. 10 illustrates a dual port random access memory core having BIST logic that utilizes a portion of the memory to generate pseudorandom sequences of data and addresses.

A further reduction in the amount of chip area needed to implement the BIST logic is possible for the case of a dual port memory core, as is illustrated in FIG. 10. In this case, no memory data register is required. Instead, the memory locations of the memory core provide the functionality of memory data register. The current data state at an input/output port 1001 of memory core 61 is transmitted through a bidirectional MUX 1002 and a MUX 1003 to LFSR logic 1004 to produce the next data state. This next data state is then applied through a bidirectional MUX 1005 to a data input/output port 1006 of memory core 61. Since the Address LFSR pattern will only repeat every $2^m$ cycles, it is guaranteed that the data will not overlap a location to which data was already written in phase one.

Figure 11:
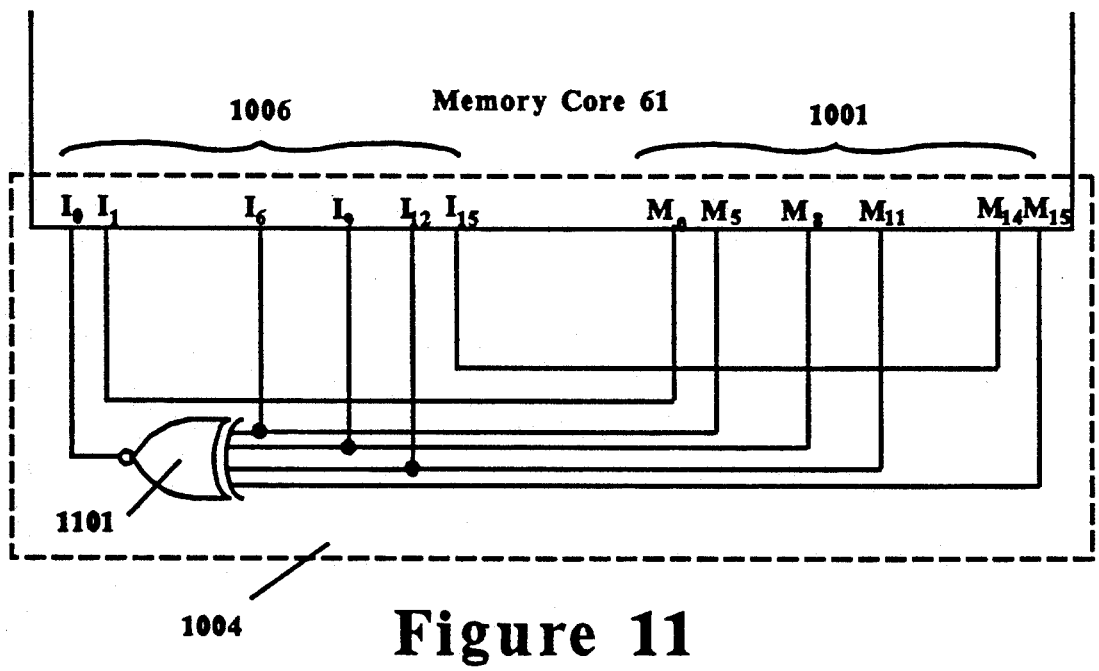
FIG. 11 illustrates the BIST logic of FIG. 10.

LFSR logic 1004 is illustrated in FIG. 11. For $k=0, \ldots, 14$, the kth line from output port 1001 is applied to the (k+1)st line of input port 1006. The 5th, 8th, 11th and 15th lines from output port 1001 are also applied to the input of an AND gate 1101. The output of this AND gate is connected to input line 0 of input port 1006 to produce the linear feedback needed to implement the LFSR.

Figure 12:
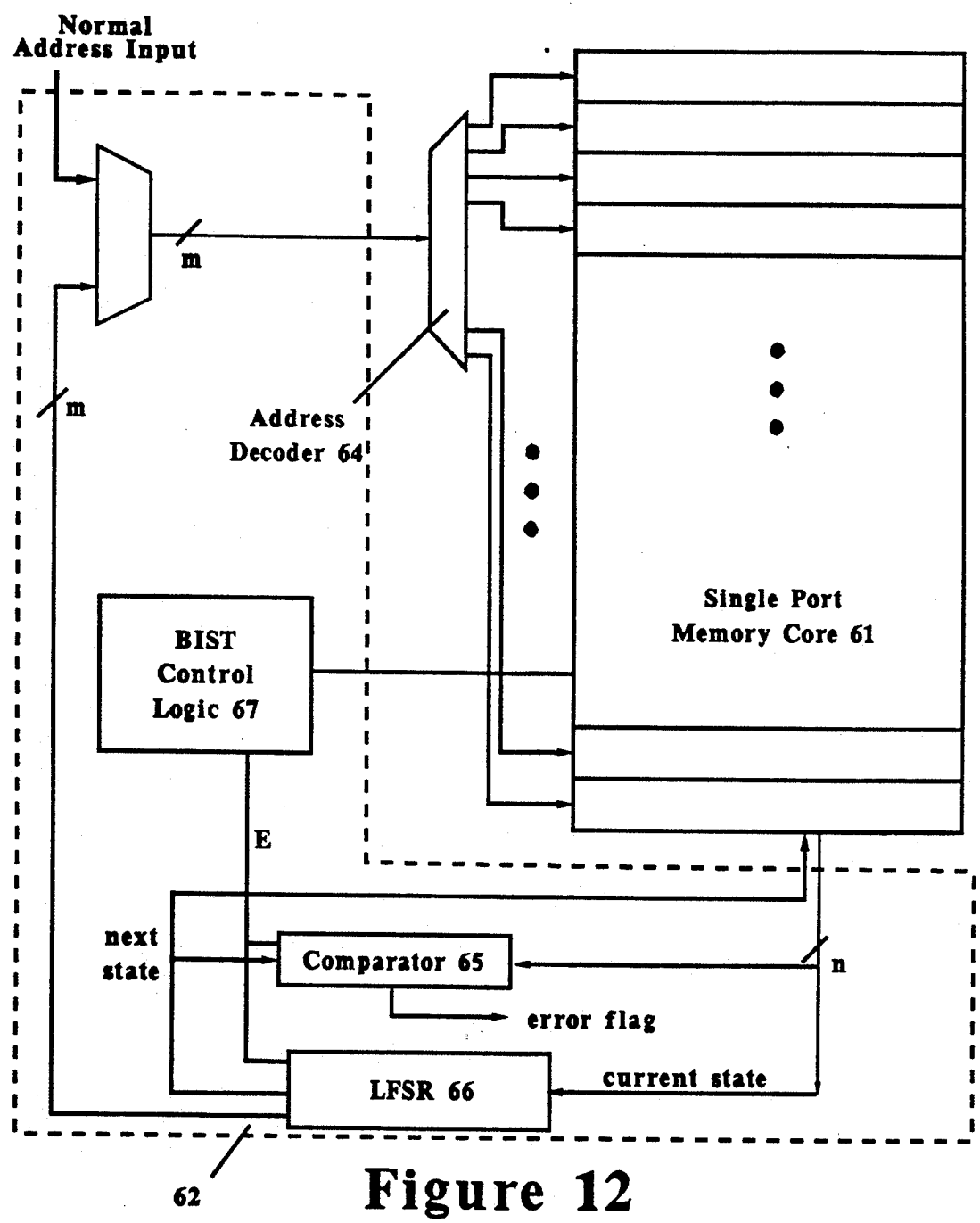
FIG. 12 illustrates a random access memory core having a single linear feedback shift register that generates pseudorandom sequences of addresses and data.

In another alternate embodiment illustrated in FIG. 12, when m is equal to or less than n, address LFSR 63 can be eliminated and the addresses can be provided from m of the output lines of data LFSR 66. After $2^m$ cycles, all addresses have been filled. Similarly, when m is equal to or greater than n, data LFSR 66 can be eliminated and the data can be provided from n of the output lines of address LFSR 63. However, there is no ability to introduce an offset after a first pass. Therefore, fault coverage cannot be improved by multiple offset passes as is possible in the previously discussed embodiments.

Figure 13:
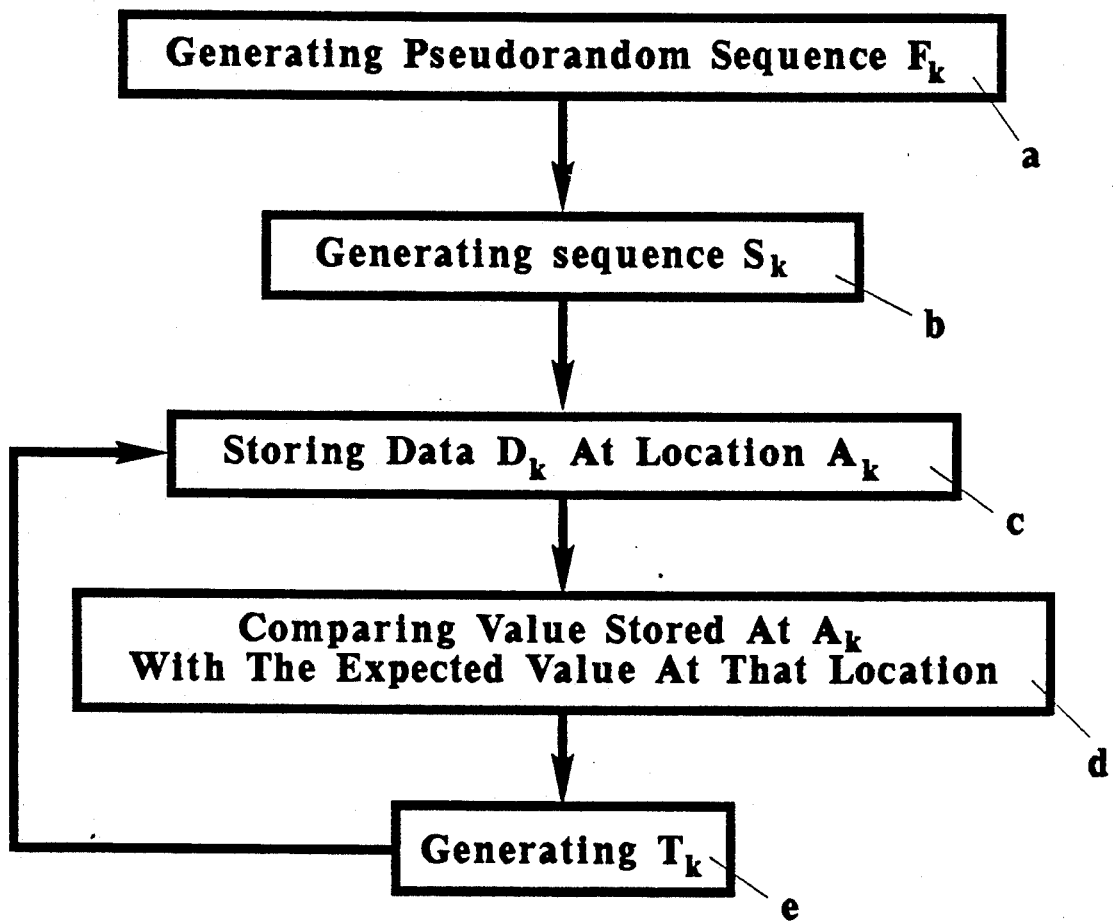
FIG. 13 is a flow diagram of the disclosed method of testing memory.

FIG. 13 is a flow diagram that illustrates the processes of generating addresses and data, storing the data in locations defined by associated addresses and comparing the data stored in these location with expected values.

I claim:

1. A method of testing memory having a set of M memory locations, said method comprising the steps of:
   (a) generating a first sequence $F_k$ that is pseudorandom;
   (b) generating a second sequence $S_k$;
   one of said first and second sequences is utilized as an address sequence $A_k$ and the other of said first and second sequences is utilized as a data sequence $D_k$;
   (c) for $k=1$ to some integer N, storing a kth data word $D_k$ in a memory location at address $A_k$;
   (d) for a sequence of values of $k=1$ to some integer L, comparing a value of data actually stored in the memory location at address $A_k$ with a value of the data word $D_k$ that was to be stored there to determine if there has been an error in storing this data word in this memory location;
   (e) generating a third sequence $T_k$ that is pseudorandom; and
   repeating steps (c) and (d) with third sequence $T_k$ in place of first sequence $F_k$.

2. A method as in claim 1 wherein N equals M and each of the N data words $D_k$ is stored in a uniquely associated address $A_k$, so that every memory location has data stored therein by step (c).

3. A method as in claim 1 wherein $T_k = F_r$ where $r = (k+q)$ Mod M for some integer q, whereby the third sequence $T_k$ is just an offset version of the first sequence $F_k$;

4. A method as in claim 1 wherein step (b) comprises the step of generating the second sequence $S_k$ with an m-bit counter.

5. A method as in claim 1 wherein step (a) comprises generating the first sequence $F_k$ with a linear feedback shift register.

6. A method as in claim 5 wherein step (e) comprises generating the third sequence $T_k$ with a linear feedback shift register.

7. A method as in claim 6 wherein the same linear feedback shift register is utilized to generate the first and third sequences.

8. A method as in claim 7 wherein the first and third sequences are utilized as addresses.

9. A method as in claim 8 wherein said linear feedback shift register also generates addresses utilized in step (d).

10. A method as in claim 9 wherein L is equal to $M-q$, for some integer q, and wherein said linear feedback shift register repeatedly generates the same sequence of addresses so that $T_k = F_r$, where $r = k-q$ mod M.

11. A method as in claim 10 wherein $N = M$, wherein $q = 1$ and wherein said linear feedback shift register generates a set of $M = 2^m$ addresses, for some integer m, in step (a) and (e) and generates $2^m - 1$ addresses in step (d).

12. A method as in claim 5 wherein step (b) comprises the step of generating the third sequence $T_k$ with a linear feedback shift register.

13. A method as in claim 12 wherein the same linear feedback shift register is utilized to generate the first and second sequences.

14. A method as in claim 13 wherein a first subset of a set of Q output lines from said linear feedback shift register provide said address $A_k$ and a subset of P output lines from said linear feedback shift register provide said data $D_k$.

15. A method as in claim 1 wherein the sequence that is utilized as the data sequence is generated by a linear feedback shift register that utilizes a memory data register of said memory as storage elements of the linear feedback shift register.

16. A method as in claim 1 wherein step (d) utilizes a core of said memory as a source of a next state data element.

17. A memory having built-in self-test logic, said memory comprising:
   a memory core having M memory locations;
   means for generating a first sequence $F_k$ that is pseudorandom, a second sequence $S_k$ and a third sequence $T_k$ that is pseudorandom;
   one of the first and second sequences functions as an address sequence $A_k$ and the other functions as a data sequence $D_k$;
   means, for each value of $k = 1, \ldots, M$, for storing the kth data element $D_k$ in a location in said memory core at address $A_k$ determined from the first and second sequences and also for storing the kth data element $D_k$ in a location in said memory core at address $A_k$ determined from said second and third sequences; and
   means for comparing expected values in said memory core with actual values stored in this memory core.

18. A memory as in claim 17 wherein $T_k$ equals $F_r$ where $r = k-q$ mod M for some integer q.

19. A memory as in claim 17 wherein said means for generating the first, second and third sequences includes a counter for generating the second sequence.

20. A memory as in claim 17 wherein said means for generating the first, second and third sequences includes a linear feedback shift register for generating pseudorandom sequences.

21. A memory as in claim 20 wherein said linear feedback shift register generates both the first and third sequences.

22. A memory as in claim 21 wherein said first and third sequences are utilized as addresses.

23. A memory as in claim 22 wherein said linear feedback shift register also generates addresses utilized by said means for comparing.

24. A memory as in claim 23 wherein said linear feedback shift register further comprises means for altering a length of pseudorandom sequence produced by this linear feedback shift register.

25. A memory as in claim 24 wherein said linear feedback shift register can produce sequences of length $2^m$ and length $2^m-1$ for some integer m.

26. A memory as in claim 25 wherein $M=2^m$.

27. A memory as in claim 20 wherein said addresses are produced on a set of Q output lines of said linear feedback shift register and said data is produced on a set of P output lines of said linear feedback shift register.

28. A memory as in claim 20 wherein said linear feedback shift register utilizes a memory data register of said core memory as storage elements of this linear feedback shift register.

29. A memory as in claim 20 wherein said core memory is a dual port core memory and wherein said linear feedback shift register is formed from memory elements within said core and additional logic.

* * * * *